US006309554B1

(12) United States Patent
Fujishima et al.

(10) Patent No.: US 6,309,554 B1
(45) Date of Patent: Oct. 30, 2001

(54) METHOD FOR PRODUCING NEEDLE DIAMOND-TYPE STRUCTURE

(75) Inventors: Akira Fujishima, Kawasaki; Hideki Masuda, Hachioji, both of (JP)

(73) Assignee: The University of Tokyo, Tokyo (JP)

(*) Notice: Subject to any disclaimer, the term of this patent is extended or adjusted under 35 U.S.C. 154(b) by 0 days.

(21) Appl. No.: 09/276,908

(22) Filed: Mar. 26, 1999

(30) Foreign Application Priority Data

Jun. 12, 1998 (JP) ................................................ 10-164772

(51) Int. Cl.[7] ........................................................ B81B 7/04
(52) U.S. Cl. ................................. 216/11; 216/41; 216/57
(58) Field of Search ................................. 216/11, 39, 40, 216/41, 57, 67, 81

(56) References Cited

U.S. PATENT DOCUMENTS

| | | | | |
|---|---|---|---|---|
| 4,957,591 | | 9/1990 | Sato et al. | 156/643 |
| 5,344,526 | * | 9/1994 | Nishibayashi et al. | 156/643 |
| 5,399,238 | * | 3/1995 | Kumar | 156/643 |
| 5,844,252 | | 12/1998 | Shiomi et al. | 257/10 |
| 6,139,713 | * | 10/2000 | Masuda | 205/206 |

FOREIGN PATENT DOCUMENTS

| | | | | |
|---|---|---|---|---|
| A-63-34927 | | 2/1988 | (JP) . | |
| A-7-202164 | | 8/1995 | (JP) . | |
| 2000001393A | * | 1/2000 | (JP) | C30B/29/04 |

OTHER PUBLICATIONS

Field Emitter Arrays Based on Natural Selforganized Porous Anodic Alumina, Govyadinov et al., Dec., 1997, Technical Digest of IVMC'97 Kyongju, Korea.*

* cited by examiner

*Primary Examiner*—Randy Gulakowski
*Assistant Examiner*—Allan Olsen
(74) *Attorney, Agent, or Firm*—Venable; Robert J. Frank; Ashley J. Wells

(57) ABSTRACT

A method of producing a needle-like diamond structure including the steps of forming a layer of anodized alumina on a diamond substrate, the anodized alumina having a plurality of through holes; vapor-depositing a substance resistant to plasma etching by a vacuum vapor-depositing method to form dots on said diamond substrate, wherein the layer of anodized alumina acts as a mask for the vapor deposition; removing the anodized alumina; and performing a plasma etching treatment while using the dots as a mask, thereby forming regularly-arranged, needle-like diamond columns.

10 Claims, 4 Drawing Sheets

METHOD FOR PRODUCING NEEDLE DIAMOND-TYPE STRUCTURE

BACKGROUND OF THE INVENTION

1. Field of the Invention

The present invention relates to a method for producing a needle diamond-type structure.

2. Description of the Related Art

Needle diamond-type structures, especially those which have been subjected to doping to attain electrical conductivity are used in electron-emitting sources for display, gas sensors, electrode materials and the like. To be used for such purposes, it is generally important for the needle diamond-type structure to have a minute and regular structure in order to improve the performance of the end-product. A conventional method of forming such a minute and regular structure involves steps in which a mask having a etching-resistant property is applied on a diamond substrate; patterning is performed using a photomask; and then selective etching is performed using a dry etching method.

In addition to the above conventional method, a method for producing a regularly-arranged, minute needle-type structure is also known, in which a casting-structure having minute and regularly arranged dents (cavities) is made of materials like Si in advance using conventional lithography; a diamond is grown by a vapor growth method while using the casting-structure as a mold; and then the casting structure used as a mold is selectively removed by dissolving.

However, the conventional methods employing a resist and exposure technique are limited with regard to minuteness of structures that can be fabricated, due to the diffraction limit of light. Further, if electric beam depiction is used, which can draw more minute patterns, drawing of a pattern requires a longer time, thereby causing a significant increase in the total cost. Moreover, all conventional patterning methods wherein a resist is used commonly require rather complicated steps of application of a resist, exposure to light, and removal of the resist.

With respect to the other type of conventional method, in which a casting structure is made using conventional lithography and a diamond film is formed thereon by a vapor growth method, the limit of fineness depends on the uniformity of the vapor-grown diamond film. Accordingly, since nucleation density of diamond in a vapor growth method is low, there is a certain limit to the fineness of processing.

SUMMARY OF THE INVENTION

It is, therefore, an object of the present invention to provide a method for producing a needle diamond-type structure, in which fine needle-type structures are regularly arranged in a large area at relatively low cost, without including such complicated steps that have been necessary for the above-mentioned conventional methods.

To accomplish the above-mentioned object, there is provided according to the present invention, a method for producing a needle diamond-type structure comprising steps of forming an anodized alumina layer on a diamond substrate, which anodized alumina layer has a plurality of through holes and functions as a mask; vapor-depositing a substance resistant to plasma etching by a vacuum vapor-depositing method to form vacuum vapor-deposited dots on the diamond substrate; removing the anodized alumina layer; and performing a plasma etching treatment while using the vacuum vapor-deposited dots as a mask, thereby forming regularly arranged needle-type diamond columns.

The term "through holes" is used herein to refer to holes that go all the way through a substance, for example, an anodized alumina layer. More specifically, in the method according to the present invention, a mask of anodized alumina having a number of minute through holes which are orthogonal to the surface thereof is formed on a diamond substrate; a substance such as a metal, metal oxide or the like is deposited thereon by a vacuum vapor-depositing method; and then the anodized alumina is selectively dissolved by sodium hydroxide or the like, thereby resulting in an arrangement of dots of the deposited substance which corresponds to the pore (i.e., through hole) arrangement of the anodized alumina on a surface of the diamond substrate. The diameters of the pores and the distances therebetween can be regulated by controlling the conditions for anodic oxidation (anodization) and a post-treatment. For the purpose of using an anodized alumina as a mask for vacuum deposition, the aluminum base metal is removed from such anodized alumina and then, the bottom portion of the anodized alumina film is removed by dissolution with use of a solution of, for example, phosphoric acid or the like [Japanese Journal of Applied Physics, vol. 35 P.L126 (1996)]. Various substances may be used to form the minute dots in the vacuum vapor-deposition method, as long as they can be deposited by such a method and are resistant to the plasma etching conducted afterward; such substances include metals, such as Au, Ag, Ni and Cr, metal oxides and metal nitrides.

By conducting a plasma etching treatment while using the vapor deposited dots formed on the diamond substrate as an etching mask and then selectively removing the mask of dots by dissolution, one obtains a needle diamond-type structure having a regular arrangement of minute needle-type columns that corresponds to the arrangement of the dots. The diameters of the needle-type columns and the distances therebetween are identical to those of the dots that were formed using the mask of anodized alumina. Therefore, configuration of the needle diamond-type structure can be regulated by adjusting the geometrical pattern of the through holes in the anodized alumina.

An inert gas, like argon, as well as a gas including oxygen can be effectively used as a gas for etching in the method according to the present invention. The needle-type structure which is formed on a diamond substrate by a method according to the present invention depends on the form of anodized alumina which is used as a mask. It is known that anodized alumina has pores of a uniform diameter which is within a range between 10 nm to 400 nm, and such diameter can be controlled by controlling conditions for anodic oxidation (anodization) and a process of post-treatment.

BRIEF DESCRIPTION OF THE DRAWINGS

The present invention will be explained in further detail with reference to the attached drawings, in which.

DETAILED DESCRIPTION OF THE PREFERRED EMBODIMENTS

Now, a preferred embodiment of the present invention will be described in detail by referring to the attached drawings.

Figure 1:
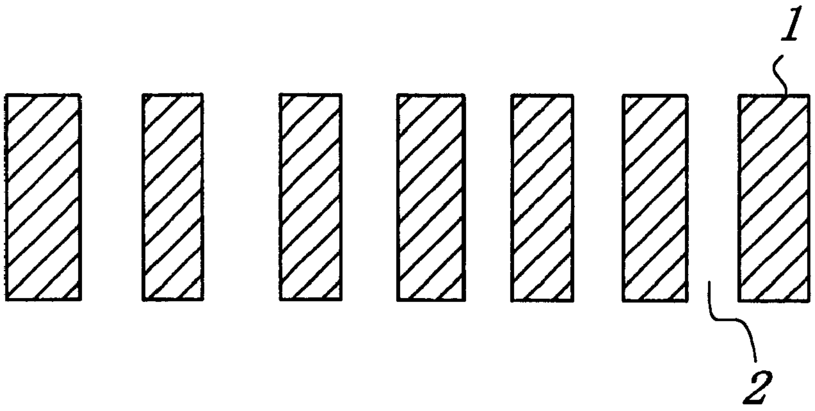
FIG. 1 is a cross-sectional view showing an anodized alumina layer which is used as a mask for vacuum deposition in a method according to the present invention.
Figure 2:
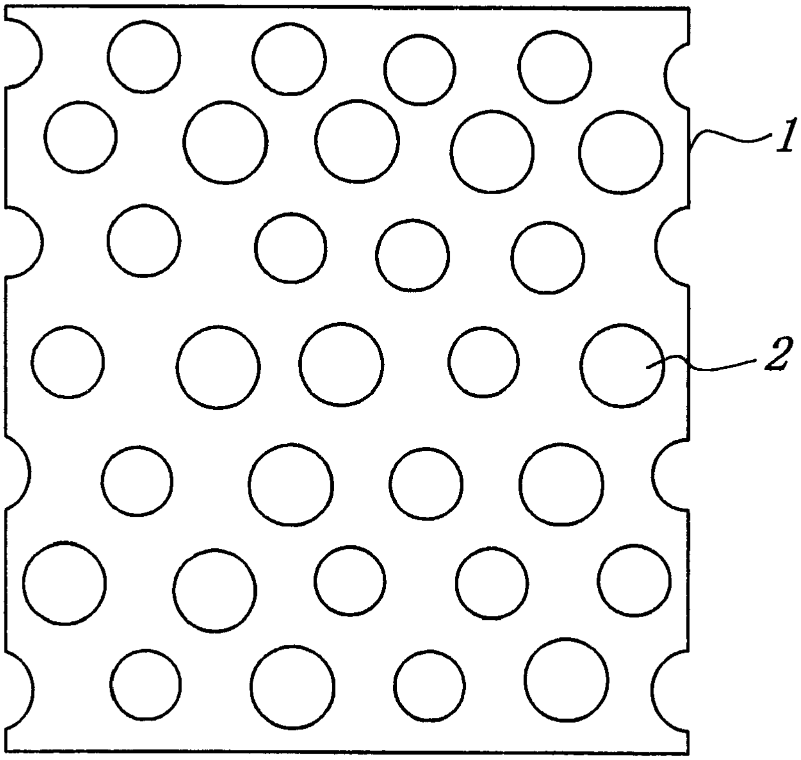
FIG. 2 is a plan view illustrating the arrangement of pores in an anodized alumina layer.

Referring to FIG. 1, there is shown a porous anodized alumina 1 which is used as a mask for vacuum vapor deposition in a preferred embodiment of the method according to the present invention. The anodized alumina 1 has pores 2 which are regularly arranged as schematically illustrated in FIG. 2. Those of anodized alumina that have pores of a diameter within a range of 5 nm–400 nm and inter-pore distances falling within a range of 100 nm–500 nm can be effectively used in a preferred embodiment of the present invention. In the method of the present invention, it is desirable to use an anodized alumina layer having a thickness of 0.1–0.5 $\mu$m as a mask for vacuum vapor deposition.

Figure 3:
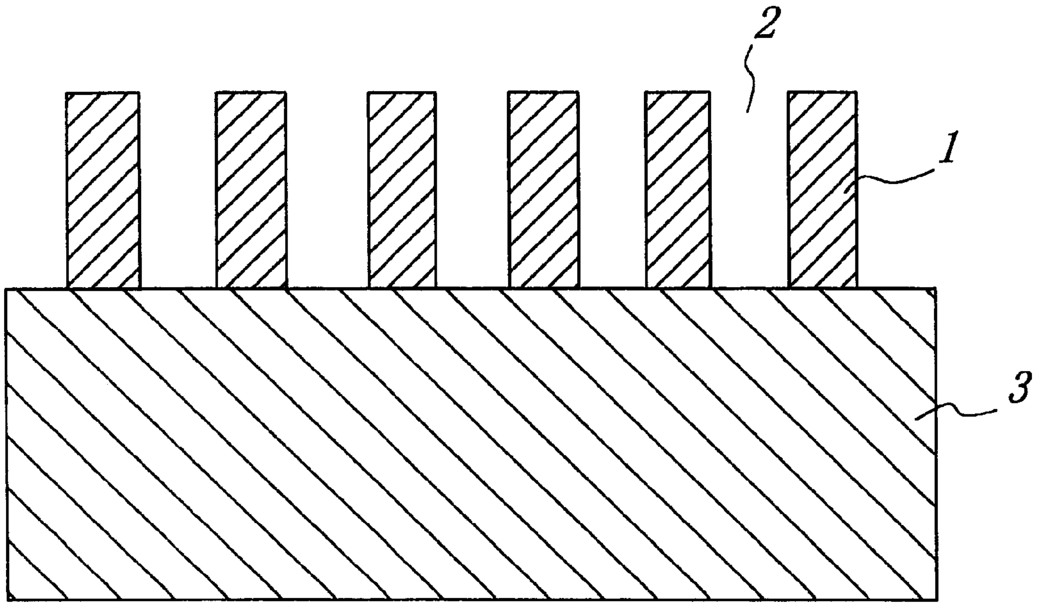
FIG. 3 is a cross-sectional view depicting a diamond substrate on which a mask for vacuum deposition is placed.

Referring to FIG. 3, there is illustrated a diamond substrate 3 on which the anodized alumina 1 is placed as a mask for vacuum vapor deposition. A natural diamond, as well as a synthesized single-crystalline or polycrystalline diamond, can be adequately used as a substrate in a preferred embodiment of the present invention. These diamonds are subjected to a surface polishing process if necessary.

Figure 4:
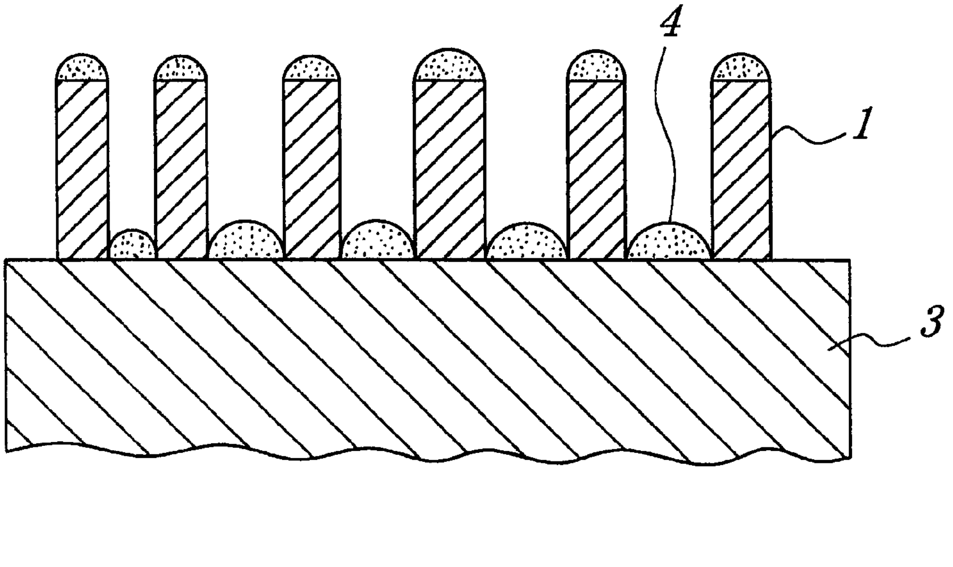
FIG. 4 is a cross-sectional view showing the state after the vacuum vapor deposition was conducted using the mask for vacuum vapor deposition.
Figure 5:
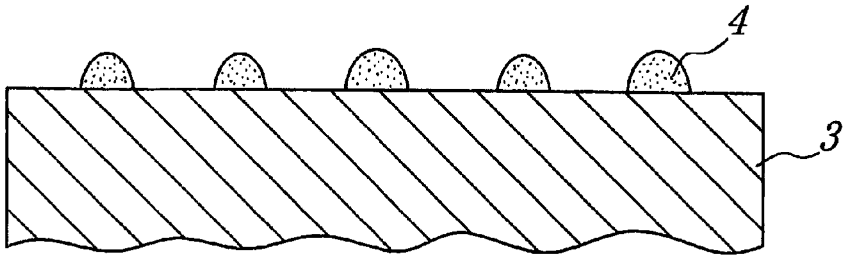
FIG. 5 is a cross-sectional view depicting an arrangement of dots formed on the diamond substrate by vacuum vapor deposition.

As shown in FIG. 4, a metal, a metal oxide or a metal nitride is evaporized on the diamond substrate 3, on which the anodized alumina has already been placed as a mask, using a vacuum vapor-deposition apparatus. The amount of the substance so deposited may be considered to be enough when the thus-deposited dots have such a thickness that is sufficient for functioning as a mask that is resistant to the plasma etching treatment that is conducted afterward. Accordingly, the thus-formed dots usually have a thickness of 20 nm–30 nm. After completion of such vacuum vapor deposition, the anodized alumina mask is removed from the diamond substrate 3 by dissolution and, the result is an arrangement of minute evaporized dots 4 as shown in FIG. 5. For the purpose of selectively removing the anodized alumina mask, an alkaline solution, like one of sodium hydroxide, or an acid solution can be used, as long as such solution dissolves the anodized alumina but does not dissolve the substance which is used to form the dots.

Figure 6:
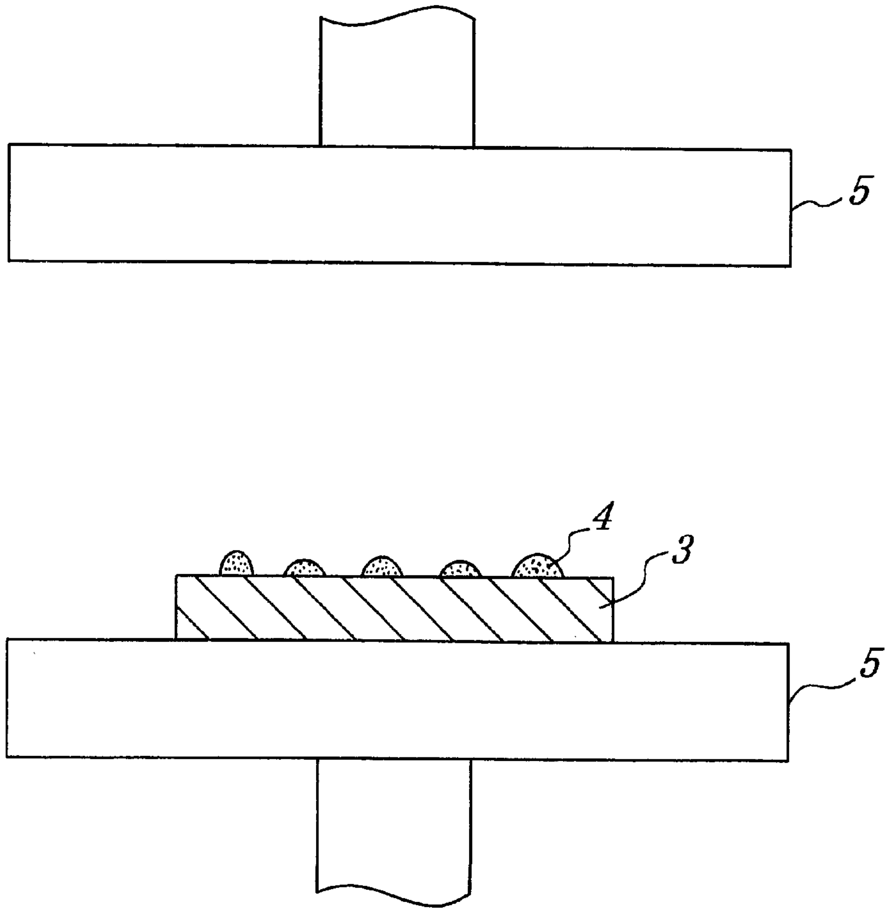
FIG. 6 is a diagram schematically showing the state of plasma etching within a plasma etching device.
Figure 7:
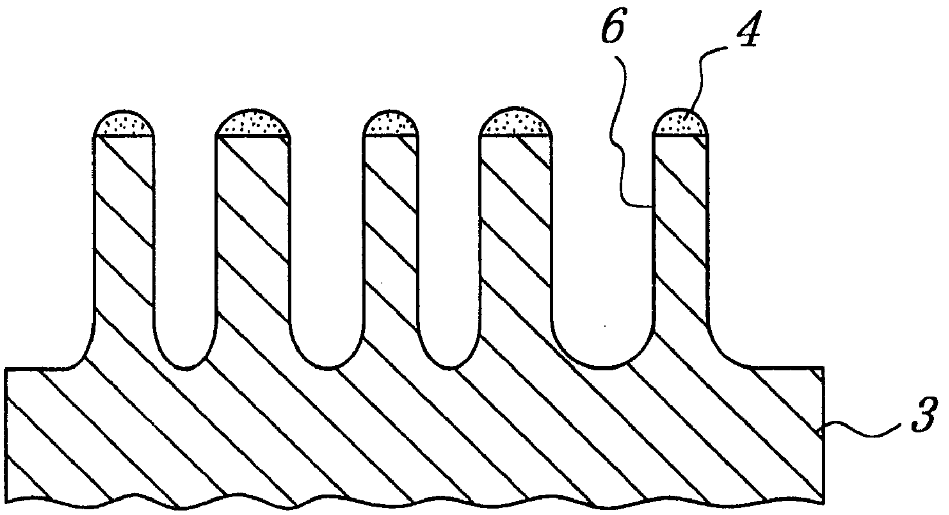
FIG. 7 is a cross-sectional view illustrating the diamond substrate after the plasma etching.

The diamond substrate 3, which has the arrangement of dots 4 on the surface thereof, is placed on a plasma electrode 5 in a plasma etching container as shown in FIG. 6, and plasma etching is performed. Activated-species excited by plasma etch the exposed part of the diamond substrate 3, but since the evaporized dots function as a mask, the activated-species do not etch those parts of the diamond substrate 3 which are covered with the dots. As a result, the diamond substrate 3 is selectively etched, thereby resulting in a regular arrangement of needle-type diamond columns 6 that corresponds to the arrangement of the dots as shown in FIG. 7. Note that when oxygen is included in a gas for plasma excitation, the etching rate can be greatly increased.

Figure 8:
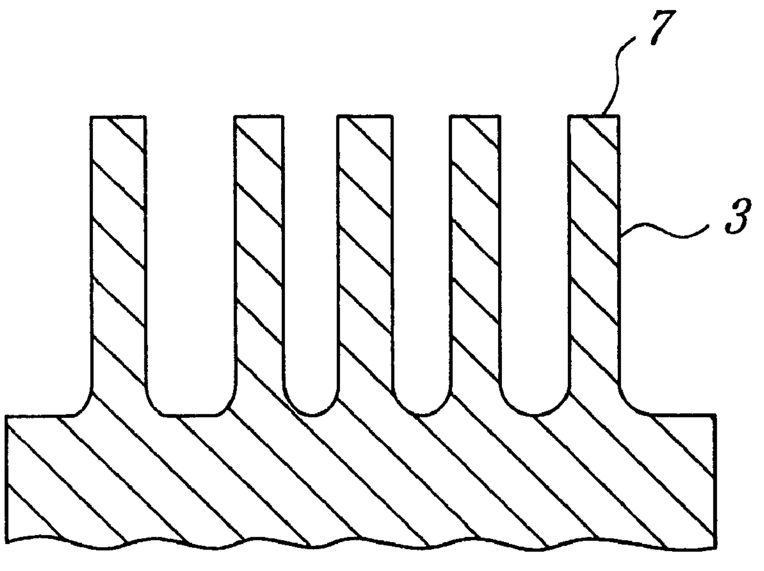
FIG. 8 is a cross-sectional view showing a needle diamond-type structure which is produced by a method according to the present invention.

Following etching, the minute dots used as the etching mask are selectively removed from the diamond substrate 3, and the result is a minute needle diamond-type structure 7 as illustrated in FIG. 8.

The present invention will be explained in further details referring to specific examples. The following examples are given in illustration of the present invention and are not intended as limitations thereof.

EXAMPLE 1

A diamond substrate which had been formed by a vapor growth method was subjected to surface polishing. Then, an anodized porous (alumina) film having through holes was placed on the diamond substrate. The diameter of the through holes of the anodized porous (alumina) film and the inter-hole distances were respectively 70 nm and 100 nm, and the thickness of the film was 0.2 $\mu$m.

Gold was vacuum vapor-deposited on the diamond substrate to have a thickness of 20 nm with use of a vacuum vapor-deposition apparatus. The degree of vacuum was $1\times10^{-5}$ Torr and the deposition rate was 0.2 nm/sec. After completion of the vacuum vapor deposition, the anodized (alumina) film was removed from the diamond substrate by dissolution using a solution of 0.1 M sodium hydroxide, thereby leaving dots of gold on the diamond substrate.

Next, the diamond substrate on which the dots of gold were formed was placed on an electrode of a parallel plate type plasma etching apparatus, and etching treatment was performed for 10 minutes while using an electric discharge gas of 100% oxygen at a gas pressure of 1 Torr, an electric discharge frequency of 13.56 MHz, and an electric discharge input of 150 W. After completion of the etching, the dots of gold were removed by dissolving using a solution of chloronitrous acid. The result was an arrangement of needle-type diamond columns identical to the pore arrangement of the mother-type (matrix) anodized alumina. The height of each needle-type diamond column was 1.5 $\mu$m.

EXAMPLE 2

An anodized alumina mask having a pore diameter of 20 nm was placed on a diamond substrate in the same manner as in Example 1. An vacuum vapor deposition of gold was performed using this anodized alumina as a mask for vacuum vapor deposition in the same manner as in Example 1, and then etching treatment was performed, also in the same manner as in Example 1. The result was a structure with a regular arrangement of needle-type diamond columns, each having a diameter of 20 nm.

As described above, by the method according to the present invention, a needle diamond-type structure can be produced more swiftly and at a lower cost, in comparison to conventional methods. Accordingly, a diamond structure having a regular arrangement of minute needle-type columns can be produced by the method according to the present invention.

Although the invention has been described with reference to specific preferred embodiments, they were given by way of examples only and thus, it should be noted that various changes and modifications may be made on them without departing from the scope of the present invention as defined by the appended claims.

What is claimed is:

1. A method of producing a needle-like diamond structure, comprising the steps of:

forming a layer of anodized alumina on a diamond substrate, said anodized alumina having a plurality of through holes;

vapor-depositing a substance resistant to plasma etching by a vacuum vapor-depositing method to form dots on said diamond substrate, wherein said layer of anodized alumina acts as a mask for the vapor deposition;

removing said anodized alumina; and performing a plasma etching treatment while using said dots as a mask, thereby forming regularly-arranged, needle-like diamond columns.

2. The method for producing a needle-like diamond structure as set forth in claim 1, wherein said plasma etching treatment is conducted in a gaseous atmosphere including oxygen.

3. The method of producing a needle-like diamond structure as set forth in claim 1, wherein said plasma etching treatment is conducted in a gaseous atmosphere including an inert gas.

4. The method of producing a needle-like diamond structure as set forth in claim 3, wherein said inert gas is argon.

5. The method of producing a needle-like diamond structure as set forth in claim 1, wherein said substance resistant to plasma etching is a metal.

6. The method of producing a needle-like diamond structure as set forth in claim 1, wherein said substance resistant to plasma etching is a metal oxide.

7. The method of producing a needle-like diamond structure as set forth in claim 1, wherein said substance resistant to plasma etching is a metal nitride.

8. The method of producing a needle-like diamond structure as set forth in claim 1, further comprising the step of:

removing said dots formed by said vapor depositing step.

9. The method of producing a needle-like diamond structure as set forth in claim 1, wherein the step of removing said anodized alumina is performed by dissolving said anodized alumina using an alkaline solution or an acid solution.

10. The method of producing a needle-like diamond structure as set forth in claim 9, wherein the solution used to dissolve said anodized alumina is a solution of sodium hydroxide.

* * * * *

UNITED STATES PATENT AND TRADEMARK OFFICE
CERTIFICATE OF CORRECTION

PATENT NO. : 6,309,554 B1
DATED : October 30, 2001
INVENTOR(S) : Akira Fujishima It is certified that error appears in the above-identified patent and that said Letters Patent is hereby corrected as shown below:

Title page,
Item [54], please delete "METHOD FOR PRODUCING NEEDLE DIAMOND-TYPE STRUCTURE" and insert -- METHOD FOR PRODUCING A NEELDE-LIKE DIAMOND STRUCTURE --.

Signed and Sealed this

Twenty-first Day of May, 2002

*Attest:*

JAMES E. ROGAN
*Director of the United States Patent and Trademark Office*

*Attesting Officer*

UNITED STATES PATENT AND TRADEMARK OFFICE

CERTIFICATE OF CORRECTION

PATENT NO. : 6,309,554 B1
DATED : October 30, 2001
INVENTOR(S) : Akira Fujishima It is certified that error appears in the above-identified patent and that said Letters Patent is hereby corrected as shown below:

Title page,
Item [54], please delete "METHOD FOR PRODUCING NEEDLE DIAMOND-TYPE STRUCTURE" and insert -- METHOD FOR PRODUCING A NEEDLE-LIKE DIAMOND STRUCTURE --.

This certificate supersedes Certificate of Correction issued May 27, 2002.

Signed and Sealed this

Twenty-seventh Day of August, 2002

*Attest:*

JAMES E. ROGAN

*Attesting Officer* *Director of the United States Patent and Trademark Office*